(12) United States Patent
Luo et al.

(10) Patent No.: US 12,078,937 B1
(45) Date of Patent: Sep. 3, 2024

(54) NEAR-FIELD LITHOGRAPHY IMMERSION SYSTEM, IMMERSION UNIT AND INTERFACE MODULE THEREOF

(71) Applicant: The Institute of Optics and Electronics, The Chinese Academy of Sciences, Sichuan (CN)

(72) Inventors: Xiangang Luo, Sichuan (CN); Chengwei Zhao, Sichuan (CN); Yanqin Wang, Sichuan (CN); Changtao Wang, Sichuan (CN); Zeyu Zhao, Sichuan (CN); Yunfei Luo, Sichuan (CN); Mingbo Pu, Sichuan (CN); Yiyun Zhang, Sichuan (CN)

(73) Assignee: The Institute of Optics and Electronics, The Chinese Academy of Sciences, Sichuan (CN)

( * ) Notice: Subject to any disclaimer, the term of this patent is extended or adjusted under 35 U.S.C. 154(b) by 0 days.

(21) Appl. No.: 18/287,638

(22) PCT Filed: Apr. 15, 2022

(86) PCT No.: PCT/CN2022/087107
§ 371 (c)(1),
(2) Date: Oct. 19, 2023

(87) PCT Pub. No.: WO2022/222861
PCT Pub. Date: Oct. 27, 2022

(30) Foreign Application Priority Data

Apr. 22, 2021 (CN) .......................... 202110434777.9

(51) Int. Cl.
*G03F 7/00* (2006.01)
*G03F 7/20* (2006.01)

(52) U.S. Cl.
CPC ........ *G03F 7/70341* (2013.01); *G03F 7/2041* (2013.01)

(58) Field of Classification Search
CPC .......................... G03F 7/70341; G03F 7/2041
See application file for complete search history.

(56) References Cited

U.S. PATENT DOCUMENTS 6,869,737 B2  3/2005  Suzuki et al.
7,133,114 B2  11/2006 Hoogendam et al.
(Continued)

FOREIGN PATENT DOCUMENTS

CN   1570771 A   1/2005
CN   1752851 A   3/2006
(Continued)

OTHER PUBLICATIONS

Office Action issued on Mar. 12, 2024 regarding the corresponding Japanese Patent Application No. 2023-564661 (6 pages including English Translation).
(Continued)

*Primary Examiner* — Hung V Nguyen
(74) *Attorney, Agent, or Firm* — Merchant & Gould P.C.

(57) ABSTRACT

Provided is an near-field lithography immersion system, including: an immersion unit including: a liquid flow channel and a gas flow channel configured to apply gas to confine an immersion liquid provided by the liquid flow channel into an exposure field; at least two interface modules, the interface module includes a gas connector, a liquid connector and a brake connector, the gas connector and the liquid connector are correspondingly connected to the gas flow channel and the liquid flow channel, respectively, the brake connector is configured to control an assembly and a disassembly of the immersion unit, and the interface module is detachably connected to the immersion unit; and a mask loading module including a mask base plate and a mask, the immer-
(Continued)

sion liquid is guided to an edge of the mask from below the mask base plate to form an immersion field between the mask and a substrate.

10 Claims, 6 Drawing Sheets

(56) References Cited

U.S. PATENT DOCUMENTS

| | | | |
|---|---|---|---|
| 9,798,253 B2 | 10/2017 | Van Sommeren et al. | |
| 10,133,190 B2* | 11/2018 | Cortie | G03F 7/70341 |
| 10,209,629 B2 | 2/2019 | Beckers et al. | |
| 10,495,984 B2 | 12/2019 | Beckers et al. | |
| 10,503,071 B2 | 12/2019 | Fidric et al. | |
| 10,527,092 B2 | 1/2020 | Tromp et al. | |
| 10,649,349 B2* | 5/2020 | Leenders | G03F 7/70341 |
| 10,678,141 B2* | 6/2020 | Sato | G03F 7/70525 |
| 2004/0152323 A1 | 8/2004 | Suzuki et al. | |
| 2005/0147922 A1 | 7/2005 | Suzuki et al. | |
| 2006/0007419 A1 | 1/2006 | Streefkerk et al. | |
| 2006/0061739 A1 | 3/2006 | Hoogendam et al. | |
| 2006/0077367 A1 | 4/2006 | Kobayashi et al. | |
| 2006/0103818 A1 | 5/2006 | Holmes et al. | |
| 2006/0192930 A1 | 8/2006 | Iimura et al. | |
| 2006/0290909 A1 | 12/2006 | Donders et al. | |
| 2007/0064210 A1 | 3/2007 | Kobayashi et al. | |
| 2007/0122561 A1 | 5/2007 | Sewell | |
| 2007/0146663 A1 | 6/2007 | Nagasaka | |
| 2008/0174748 A1 | 7/2008 | Nagasaka | |
| 2009/0073399 A1 | 3/2009 | Chibana et al. | |
| 2010/0157265 A1 | 6/2010 | Ten Kate | |
| 2010/0271604 A1 | 10/2010 | Sewell | |
| 2012/0012191 A1 | 1/2012 | Hoshino | |
| 2012/0013860 A1 | 1/2012 | Nagasaka | |
| 2012/0013862 A1 | 1/2012 | Sato | |
| 2012/0019803 A1 | 1/2012 | Hoshino et al. | |
| 2016/0062246 A1 | 3/2016 | Clube et al. | |
| 2017/0045828 A1 | 2/2017 | Van Sommeren et al. | |
| 2018/0321594 A1 | 11/2018 | Streefkerk et al. | |

FOREIGN PATENT DOCUMENTS

| | | | |
|---|---|---|---|
| CN | 1847987 A | 10/2006 | |
| CN | 1975580 A | 6/2007 | |
| CN | 101021693 A | 8/2007 | |
| CN | 101446777 A | 6/2009 | |
| CN | 101467102 A | 6/2009 | |
| CN | 101794083 A | 8/2010 | |
| CN | 102621818 A | 8/2012 | |
| CN | 102707580 A | 10/2012 | |
| CN | 102937777 A | 2/2013 | |
| CN | 104597720 A | 5/2015 | |
| CN | 104965392 A | 10/2015 | |
| CN | 105229534 A | 1/2016 | |
| CN | 107991843 A | 5/2018 | |
| CN | 110095943 A | 8/2019 | |
| CN | 110327780 A | 10/2019 | |
| CN | 112684666 A | 4/2021 | |
| CN | 113189849 A | 7/2021 | |
| EP | 1431710 A2 | 6/2004 | |
| EP | 1494079 A1 | 1/2005 | |
| JP | 2008182241 A | 8/2008 | |
| JP | 2009302452 A | 12/2009 | |
| JP | 2010123685 A | 6/2010 | |
| JP | 2010258453 A | 11/2010 | |
| JP | 2013051292 A | 3/2013 | |
| JP | 2015015507 A | 1/2015 | |
| JP | 2017-533454 A | 11/2017 | |
| JP | 2018159959 A | 10/2018 | |
| TW | 200929331 A | 7/2009 | |
| TW | 201207575 A | 2/2012 | |
| TW | 201207901 A | 2/2012 | |
| WO | 2004105107 A1 | 12/2004 | |
| WO | 2015165653 A1 | 11/2015 | |
| WO | 2019083707 A1 | 5/2019 | |

OTHER PUBLICATIONS

International Search Report for PCT application No. PCT/CN2022/087107 dated Jul. 1, 2022 (6 pages including English Translation).
Written Opinion PCT application No. PCT/CN2022/087107 dated Jul. 1, 2022 (4 pages).
First Office Action issued on Feb. 22, 2022 for Chinese application No. 2021104347779 (13 pages including English Translation).
Fu Xin, et al. "Developments and Prospects of Immersion Control System in Immersion Lithography Machine" Journal of Mechanical Engineering, 2010, 46:16, pp. 170-175.
Zhai Likui, "Research on Fluid Transmission and Control System for Immersion Lithography", 2006 (83 pages).
Xin Fu, et al. "Flow behavior control in immersion lithography", Flow Measurement and Instrumentation, 2017, 53:190-203.

* cited by examiner

NEAR-FIELD LITHOGRAPHY IMMERSION SYSTEM, IMMERSION UNIT AND INTERFACE MODULE THEREOF

CROSS REFERENCE TO RELATED APPLICATION(S)

This application is a Section 371 National Stage Application of International Application No. PCT/CN2022/087107 filed on Apr. 15, 2022, which claims priority to Chinese Patent Application No. 202110434777.9 filed on Apr. 22, 2021, and which applications are incorporated herein by reference. To the extent appropriate, a claim of priority is made to each of the above disclosed applications.

TECHNICAL FIELD

The present disclosure relates to the field of lithography technology, and in particular, to a near-field lithography immersion system, an immersion unit of the near-field lithography immersion system and an interface module of the near-field lithography immersion system.

BACKGROUND

With the feature size of a device getting smaller and smaller, the lithography resolution is getting higher and higher, and the traditional lithography technology may no longer meet current development requirements. How to improve the resolution of the lithography technology is a core to promote a development of the lithography technology. In the projection lithography, an immersion lithography is based on a traditional dry lithography, and the lithography resolution is improved by filling a high-refractive-index liquid between the last piece of projection objective lens and the silicon wafer. It is not required to design a complicated light source and objective lens system for the immersion lithography, which may reduce a research and development cost and a risk.

The near-field lithography uses an immersion solution, which may increase a focal depth and a working distance and may also facilitate an alignment operation, so that the lithography machine may extend to a smaller node. However, due to a short working distance of the near-field lithography, it is more difficult for liquid to completely wet the mask and the substrate. How to effectively form an immersion field and how to automatically assemble and disassemble the mask in a case of increasing the immersion field have become difficult problems for an application of the immersion solution in the near-field lithography.

SUMMARY

I. Technical Problems to be Solved

In view of the above-mentioned problems, the present disclosure provides a near-field lithography immersion system, an immersion unit of the near-field lithography immersion system and an interface module of the near-field lithography immersion system, in order to solve problems in the existing near-field lithography immersion system that it is difficult for liquid to completely wet the mask and the substrate, and it is difficult to automatically disassemble and assemble the immersion unit and the mask.

II. Technical Solutions

In an aspect, a near-field lithography immersion system is provided, including: an immersion unit including a gas flow channel and a liquid flow channel, the gas flow channel is configured to apply gas to confine an immersion liquid provided by the liquid flow channel into an exposure field; at least two interface modules, the interface module includes a gas connector, a liquid connector and a brake connector, the gas connector and the liquid connector are correspondingly connected to the gas flow channel and the liquid flow channel, respectively, the brake connector is configured to control an assembly and a disassembly of the immersion unit, and the interface module is detachably connected to the immersion unit; and a mask loading module including a mask base plate and a mask, the immersion liquid is guided to an edge of the mask from below the mask base plate to form an immersion field between the mask and a substrate.

Further, the liquid flow channel includes a liquid injection flow channel and a liquid recycling flow channel, and the liquid connector includes a liquid injection connector and a liquid recycling connector; and a gas outlet of the gas flow channel, a liquid recycling port of the liquid recycling flow channel and a liquid outlet of the liquid injection flow channel are sequentially arranged at the edge of the mask from far to near.

Further, the immersion unit further includes: an immersion flow channel sealing subunit configured to seal the gas flow channel and the liquid flow channel; and a flow channel converging subunit arranged above the immersion flow channel sealing subunit, the flow channel converging subunit is configured to converge the gas flow channel and the liquid flow channel for a docking installation with the interface module.

Further, the flow channel converging subunit further includes a guide port, and the guide port is connected to the brake connector; and a plurality of flow channel converging subunits are uniformly arranged around the exposure field.

Further, a number of the interface modules is matched with a number of the flow channel converging subunits, and the interface modules are connected to the flow channel converging subunits in one-to-one correspondence.

Further, a gas inlet and a liquid inlet are provided on the immersion flow channel sealing subunit and the flow channel converging subunit, so that the gas and the immersion liquid circulate in the immersion flow channel sealing subunit and the flow channel converging subunit.

Further, the interface module further includes a connector installation plate configured to fix the gas connector, the liquid connector and the brake connector; and an outer side of the gas connector, an outer side of the liquid connector and an outer side of the brake connector are provided with a sealing ring, respectively.

Further, the interface module and the mask loading module are both arranged below a base plate in a lithography apparatus.

Further, the near-field lithography immersion system further includes: a supply and recycling system including a gas supply unit, a liquid supply unit and a liquid recycling unit, the gas supply unit, the liquid supply unit and the liquid recycling unit are connected to the gas connector, the liquid injection connector and the liquid recycling connector, respectively.

Further, the near-field lithography immersion system further includes: a control system respectively connected to the supply and recycling system and the immersion unit, the control system is configured to control supply and recycling of the gas, supply and recycling of the immersion liquid and braking of the immersion unit.

In another aspect, a near-field lithography immersion unit is provided, including an air curtain flow channel subunit, an immersion flow channel subunit, an immersion flow channel sealing subunit and a flow channel converging subunit which are sequentially stacked from bottom to top; a gas flow channel is provided in the air curtain flow channel subunit, and gas is introduced through the gas flow channel; the immersion flow channel subunit is configured to seal the gas flow channel of the air curtain flow channel subunit and is provided with a liquid injection flow channel and a liquid recycling flow channel, liquid is introduced through the liquid injection flow channel into an exposure field to form an immersion field, and the liquid is recycled through the liquid recycling flow channel, the gas forms an air curtain surrounding the immersion field at a periphery of the immersion field; the immersion flow channel sealing subunit is configured to seal the liquid injection flow channel and the liquid recycling flow channel of the immersion flow channel subunit; and the flow channel converging subunit is configured to introduce the gas and the liquid into the immersion unit through a connection to an interface module and recycle the liquid from the immersion unit.

Further, the flow channel converging subunit is provided with a gas inlet, a liquid inlet and a liquid outlet respectively connected to the gas flow channel, the liquid injection flow channel and the liquid recycling flow channel, the introduced gas enters the gas flow channel by sequentially passing through the gas inlet, a gas inlet hole provided on the immersion flow channel sealing subunit and a gas inlet hole provided on the immersion flow channel subunit, the introduced liquid enters the liquid injection flow channel by sequentially passing through the liquid inlet and a liquid inlet hole provided on the immersion flow channel sealing subunit, and led liquid flows out of the liquid recycling flow channel by sequentially passing through a liquid outlet hole provided on the immersion flow channel sealing subunit and the liquid outlet.

Further, a guide port is further provided on the flow channel converging subunit, and a brake is installed in the guide port; and a number of the flow channel converging subunits is four, and the flow channel converging subunits are uniformly arranged at four corners of the immersion unit.

Further, the air curtain flow channel subunit, the immersion flow channel subunit, the immersion flow channel sealing subunit and the flow channel converging subunit in the immersion unit are integrally formed or detachably connected to each other.

Further, the liquid injection flow channel is configured to introduce the liquid into the exposure field through a liquid outlet of the liquid injection flow channel at a predetermined angle to form the immersion field, the gas flow channel is configured to introduce gas into the periphery of the immersion field through a gas outlet of the gas flow channel arranged outside the liquid outlet of the liquid injection flow channel to form an annular air curtain, and a liquid recycling port of the liquid recycling flow channel is arranged between the gas outlet of the gas flow channel and the liquid outlet of the liquid injection flow channel.

In yet another aspect, a near-field lithography interface module is provided, the interface module is used in conjunction with the near-field lithography immersion unit described above and installed on the flow channel converging subunit, the interface module includes: a gas connector having an end installed in a gas inlet of the flow channel converging subunit to introduce gas; a liquid injection connector having an end installed in a liquid inlet of the flow channel converging subunit to introduce liquid; a liquid recycling connector having an end installed in a liquid outlet of the flow channel converging subunit to recycle the liquid; a linear guide connector having an end installed in a brake in a guide port of the flow channel converging subunit; and a connector installation plate configured to fix the other end of the gas connector, the other end of the liquid injection connector, the other end of the liquid recycling connector and the other end of the linear guide connector.

Further, a number of interface modules is matched with a number of flow channel converging subunits, and an outer side of the gas connector, an outer side of the liquid injection connector and an outer side of the liquid recycling connector are provided with a sealing ring, respectively.

In still another aspect, a near-field lithography immersion system is provided, including: an apparatus base plate; a mask loading module installed on the apparatus base plate and configured to install a mask; the near-field lithography immersion unit described above installed on the apparatus base plate through the interface module described above; a supply and recycling system configured to provide gas and liquid to the near-field lithography immersion unit through the interface module and recycle the liquid; and a control system electrically connected to the supply and recycling system and the near-field lithography immersion unit to control liquid supply, gas supply, recycling and braking.

Further, the mask loading module includes a mask sucker, a mask base plate and a mask which are sequentially arranged from top to bottom, the mask and the mask base plate are integrally formed or detachably connected to each other, and a size of the mask is the same as a size of an exposure field.

Further, the air curtain flow channel subunit of the immersion unit and the immersion flow channel subunit of the immersion unit are at least guided from below a mask base plate to an edge of the mask.

III. Beneficial Effects

The present disclosure provides a near-field lithography immersion system, an immersion unit of the near-field lithography immersion system and an interface module of the near-field lithography immersion system. Through the arrangement of the gas flow channel and the liquid flow channel, the air curtain surrounding the mask is formed by using the gas, so as to confine the liquid in the exposure field, which is beneficial to improving an immersion degree of the immersion liquid in the mask and the substrate. The interface module is designed to be detachably connected to the immersion unit, which may realize the automatic disassembly and assembly of the immersion unit and the mask (the mask and the mask base plate) and facilitate the mask replacement.

REFERENCE NUMERALS

1—immersion unit, 1-1—air curtain flow channel subunit, 1-2—immersion flow channel subunit, 1-3—immersion flow channel sealing subunit, 1-4—flow channel converging subunit, 2—interface module, 2-1—gas connector, 2-2—liquid injection connector, 2-3—liquid recycling connector, 2-4—linear guide connector, 2-5—connector installation plate, 2-6—sealing ring, 2-7—brake, 3—mask loading module, 3-1—apparatus base plate, 3-2—mask sucker, 3-3—mask base plate, 3-4—mask, 3-5—substrate, 4—supply and recycling system, 5—control system.

DETAILED DESCRIPTION OF EMBODIMENTS

In order to make objectives, technical solutions and advantages of the present disclosure clearer, the present disclosure will be further described in detail below with reference to specific embodiments and accompanying drawings.

Terms used here are only for the purpose of describing specific embodiments and are not intended to limit the present disclosure. Terms "include", "comprise", "contain", etc. used here indicate the presence of described features, steps, operations and/or components, but do not exclude the presence or addition of one or more other features, steps, operations and/or components.

In the descriptions of the present disclosure, it should be understood that terms indicating orientation or positional relationships are based on orientation or positional relationships shown in the accompanying drawings, and are only for convenience of describing the present disclosure and simplifying the descriptions, but do not indicate or imply that the apparatus or element referred to must have a specific orientation, be constructed and operated in a specific orientation, so these terms should not be construed as limiting the present disclosure.

All terms (including technical and scientific terms) used here have meanings generally understood by those of ordinary skilled in the art, unless otherwise defined. It should be noted that the terms used herein should be interpreted as having the meaning consistent with the context of the present disclosure, and should not be interpreted in an idealized or overly rigid manner.

Compared with a dry lithography machine with gas as an intermediate medium, an existing immersion lithography device in a projection lithography may improve a numerical aperture (NA) of a projection objective by filling a high-refractive-index liquid (which is called an immersion liquid) between the last piece of projection objective and a substrate and increasing a refractive index (n) of the liquid medium, so that a resolution and a focal depth of the lithography device may be improved.

Figure 1:
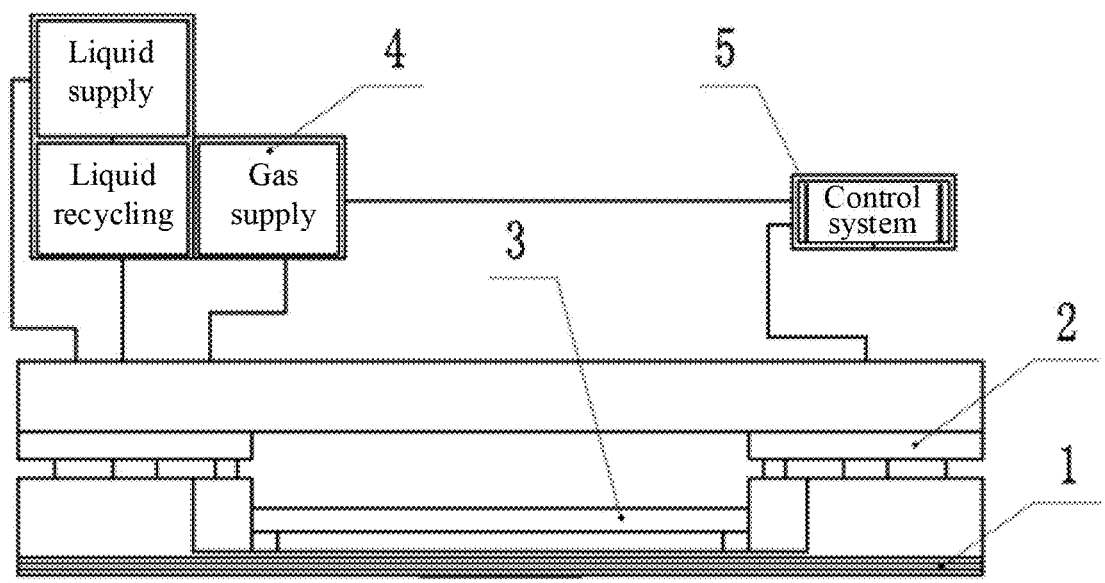
FIG. 1 schematically shows an overall schematic structural diagram of a near-field lithography immersion system according to embodiments of the present disclosure.
Figure 2:
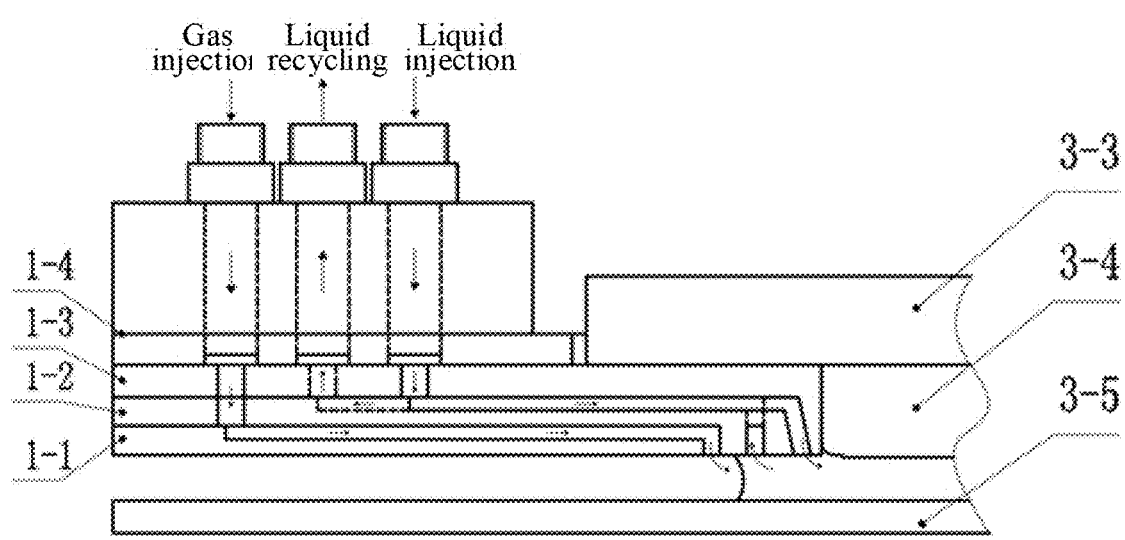
FIG. 2 schematically shows a schematic structural diagram of an immersion unit according to embodiments of the present disclosure.

Refer to FIG. 1 and FIG. 2, for the immersion lithography, the present disclosure provides a near-field lithography immersion system. The near-field lithography immersion system includes: an immersion unit 1 including a gas flow channel and a liquid flow channel, the gas flow channel is used to apply gas to confine an immersion liquid provided by the liquid flow channel into an exposure field; at least two interface modules 2 each including a gas connector, a liquid connector and a brake connector, the gas connector and the liquid connector are correspondingly connected to the gas flow channel and the liquid flow channel, respectively, the brake connector is used to control an assembly and a disassembly of the immersion unit 1, and the interface module 2 is detachably connected to the immersion unit 1; and a mask loading module 3 including a mask base plate 3-3 and a mask 3-4, liquid is guided to an edge of the mask 3-4 from below the mask base plate 3-3 to form an immersion field between the mask 3-4 and a substrate 3-5.

Figure 4:
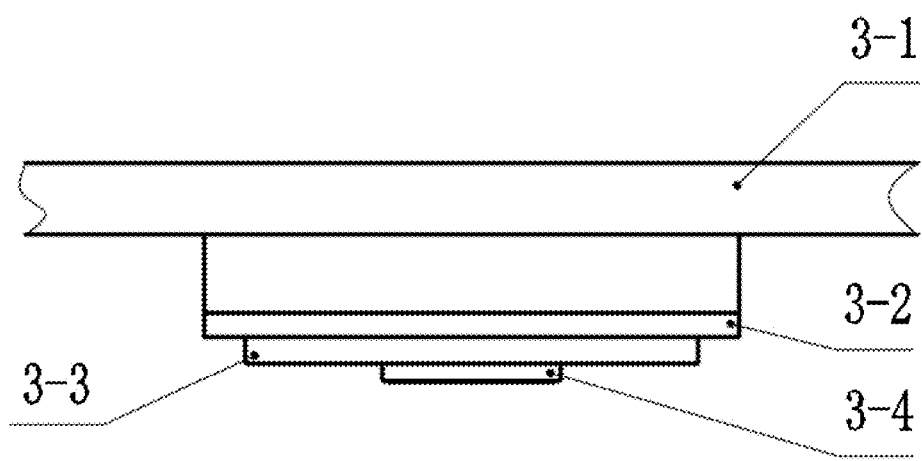
FIG. 4 schematically shows a schematic structural diagram of a base plate and a mask loading module in a lithography apparatus according to embodiments of the present disclosure.

FIG. 1 is an overall schematic structural diagram of a near-field lithography immersion system, and FIG. 2 is a schematic structural diagram of an immersion unit 1 in FIG. 1. The gas flow channel forms an air curtain surrounding the mask 3-4 by applying high-pressure gas, so as to confine the immersion liquid in a certain region, which may effectively seal the immersion liquid. This may not only avoid an immersion liquid residue in other regions of the substrate due to an overflow of the immersion liquid in the exposure field, but also improve an immersion degree of the immersion liquid between the mask and the substrate. The immersion unit 1 obtains the gas and the immersion liquid through the interface module 2, and the interface module 2 is detachably connected to the immersion unit 1. In addition to the gas connector and the liquid connector, the interface module 2 further includes the brake connector. The brake connector is connected to a guide port of the immersion unit 1, and is used to automatically control a disassembly and an assembly of the immersion unit 1. As shown in FIG. 4, the mask loading module 3 is installed below a base plate 3-1 in a lithography apparatus, and the mask loading module 3 further includes a mask sucker 3-2 used to suck the mask base plate 3-3 and the mask 3-4. The immersion liquid provided by the immersion unit 1 is filled between the mask 3-4 and the substrate 3-5 to form the immersion field.

The immersion system is usually used in the field of projection lithography. A mask of the projection lithography is located above a projection objective lens, and the immersion unit is installed below the projection objective lens with a central axis of the projection objective lens as a center of a circle. An arrangement of the immersion unit is independent of the mask, the immersion field is located between the projection objective lens and the substrate, and a required size of the immersion field is determined by a size of the projection objective lens. Because the projection objective lens is hardly changed in the projection lithography, and a change of the mask does not affect the immersion unit, the immersion unit is usually installed on the projection objective lens in a fixed connection manner.

However, in the near-field lithography to which the immersion system of the present disclosure is applied, the immersion field is not formed between the projection objective lens and the substrate, but between the mask and the substrate. Moreover, a liquid film thickness of the immersion field in the near-field lithography is reduced from a traditional millimeter level to nanometer and micron levels. More importantly, the immersion unit of the near-field lithography is directly related to a size and a loading of the mask. Therefore, the traditional immersion unit is completely incompatible.

By contrast, in the present disclosure, gas injection, liquid recycling and liquid injection flow channels of the immersion unit 1 may be converged through the interface module 2 and may be connected to a supply and recycling system 4, which may not only avoid a leakage of the immersion liquid and the gas caused by too many connection points between the immersion unit and the supply and recycling system, but also conveniently and quickly replace a different immersion unit 1 that is used in conjunction with the mask through the interface module 2 when different masks are replaced.

On the basis of the above-mentioned embodiment, the liquid flow channel includes a liquid injection flow channel and a liquid recycling flow channel, and the liquid connector includes a liquid injection connector and a liquid recycling connector. A gas outlet of the gas flow channel, a liquid recycling port of the liquid recycling flow channel and a liquid outlet of the liquid injection flow channel are sequentially arranged at the edge of the mask 3-4 from far to near.

The liquid flow channel includes the liquid injection flow channel and the liquid recycling flow channel. The immersion liquid is provided to a gap between the mask 3-4 and the substrate 3-5 through the liquid injection flow channel, and is recycled from the gap between the mask 3-4 and the substrate 3-5 through the liquid recycling flow channel. The immersion liquid continuously flows between the mask 3-4 and the substrate 3-5 to form a stable immersion field. A continuous renewal of the immersion liquid may be realized by providing the liquid injection flow channel and the liquid recycling flow channel, and contaminations, micro-nano bubbles, etc., may be taken away from the exposure field in time, so as to ensure a high purity of the immersion liquid.

On the basis of the above-mentioned embodiment, the immersion unit 1 further includes: an immersion flow channel sealing subunit 1-3 used to seal the gas flow channel and the liquid flow channel; a flow channel converging subunit 1-4 arranged above the immersion flow channel sealing subunit 1-3. The flow channel converging subunit 1-4 is used to converge the gas flow channel and the liquid flow channel for a docking installation with the interface module 2.

The immersion unit 1 includes a plurality of gas flow channels and a plurality of liquid flow channels. All of the gas flow channels are arranged in a same layer to form a gas flow channel layer, and all of the liquid flow channels are arranged in a same layer to form a liquid flow channel layer. For example, the gas flow channel layer, the liquid flow channel layer, the immersion flow channel sealing subunit 1-3 and the flow channel converging subunit 1-4 may be sequentially arranged from bottom to top. A lower surface of the liquid flow channel layer seals the gas flow channel layer, and the immersion flow channel sealing subunit 1-3 is used to seal the gas flow channel layer and the liquid flow channel layer which are arranged below the immersion flow channel sealing subunit 1-3. The flow channel converging subunit 1-4 is used to converge the gas flow channel and the liquid flow channel. Each flow channel converging subunit 1-4 may converge one gas flow channel, one liquid recycling flow channel and one liquid injection flow channel, or converge a plurality of gas flow channels, a plurality of liquid recycling flow channels and a plurality of liquid injection flow channels.

On the basis of the above-mentioned embodiment, the flow channel converging subunit 1-4 further includes a guide port, and the guide port is connected to the brake connector. The flow channel converging subunits 1-4 are uniformly arranged around the exposure field.

Figure 3:
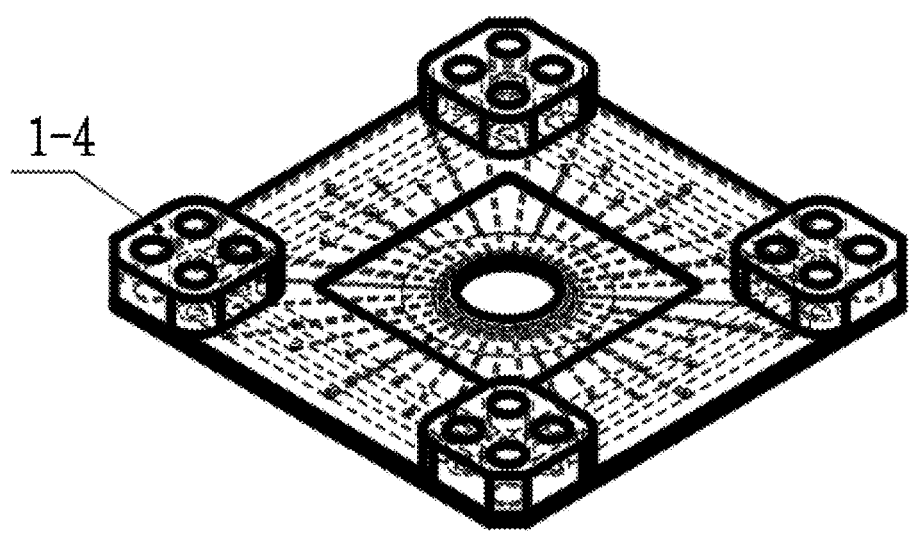
FIG. 3 schematically shows a schematic structural diagram of a flow channel converging subunit according to embodiments of the present disclosure.

As shown in FIG. 3, each flow channel converging subunit 1-4 includes four interfaces, three of which are respectively connected to the gas flow channel, the liquid recycling flow channel and the liquid injection flow channel which are arranged below the flow channel converging subunit, and the other of which is the guide port. The exposure field is a central circular region in FIG. 3. For example, the gas flow channel, the liquid recycling flow channel and the liquid injection flow channel may be arranged radially from the circular region and converged together in the flow channel converging subunit 1-4. The flow channel converging subunits 1-4 are uniformly arranged around the circular region.

On the basis of the above-mentioned embodiment, the number of the interface modules 2 is matched with the number of the flow channel converging subunits 1-4, and the interface modules 2 are connected to the flow channel converging subunits 1-4 in one-to-one correspondence.

Figure 5:
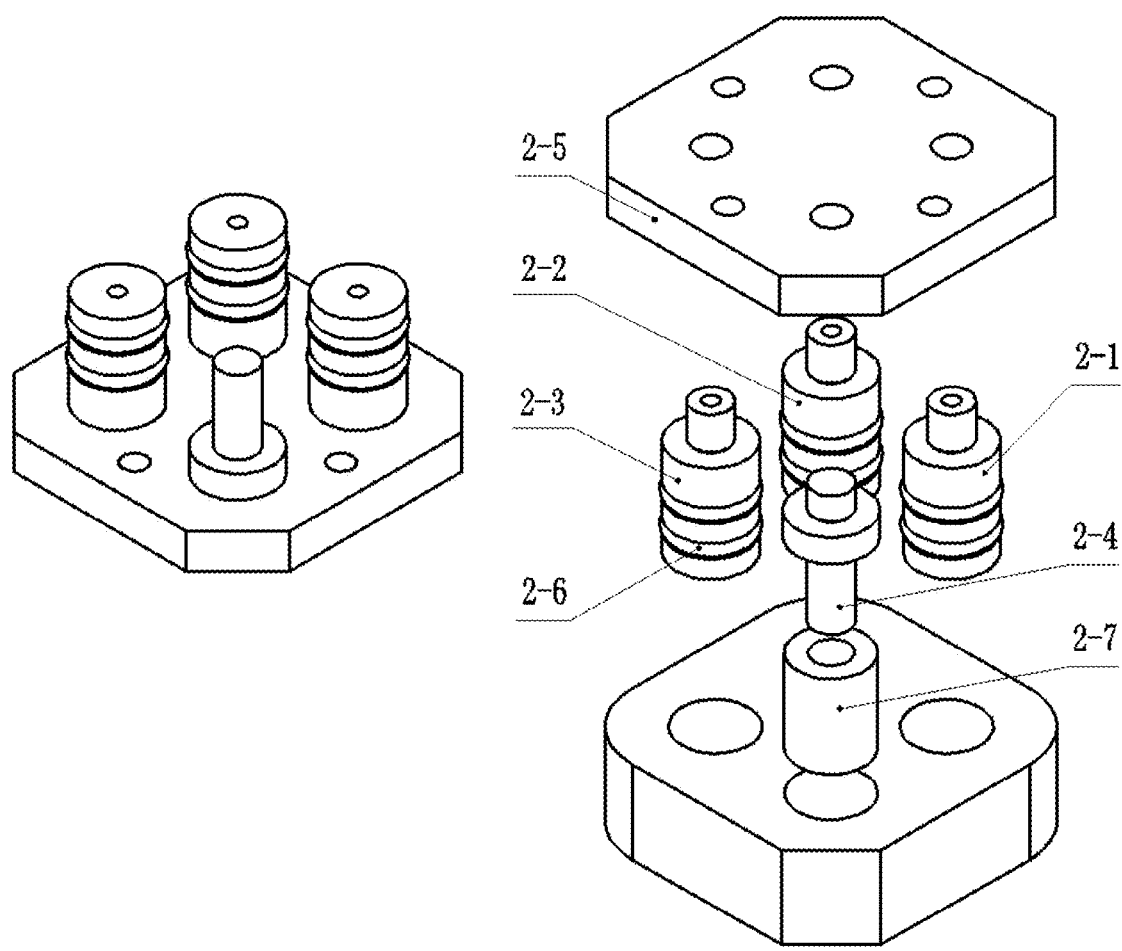
FIG. 5 schematically shows a schematic structural diagram of an interface module according to embodiments of the present disclosure.

As shown in FIG. 3 and FIG. 5, the flow channel converging subunit 1-4 is used for an adaptive installation with the interface module 2. The gas flow channel, the liquid recycling flow channel and the liquid injection flow channel which are converged are respectively connected to a gas connector 2-1, a liquid recycling connector 2-3 and a liquid injection connector 2-2, and the interface module 2 is detachably connected to the immersion unit 1 through the flow channel converging subunit 1-4. For example, as shown in FIG. 3, the number of the channel converging subunits 1-4 is four. Accordingly, there is also provided with four interface modules 2 which are correspondingly arranged above the flow channel converging subunits 1-4.

On the basis of the above-mentioned embodiment, a gas inlet and a liquid inlet are provided on the immersion flow channel sealing subunit 1-3 and the flow channel converging subunit 1-4, so that the gas and the liquid may circulate in the immersion flow channel sealing subunit 1-3 and the flow channel converging subunit 1-4.

The immersion flow channel sealing subunit 1-3, the flow channel converging subunit 1-4, the gas flow channel layer and the liquid flow channel layer are mutually sealed. The immersion flow channel sealing subunit 1-3 and the flow channel converging subunit 1-4 are provided, in a lower flow channel plate thereof, with a gas inlet at a position corresponding to the gas flow channel and a liquid inlet at a position corresponding to the liquid flow channel. The immersion flow channel sealing subunit 1-3, the flow channel converging subunit 1-4, the gas flow channel layer and the liquid flow channel layer are stacked and sealed, and the liquid injection, liquid recycling and gas injection flow channels are converged through the flow channel converging subunit 1-4, which may have fewer connection points with an external supply and recycling system 4 and a better sealing performance compared with a micro-flow channel arrangement in which only the gas flow channel and the liquid flow channel are provided.

On the basis of the above-mentioned embodiment, the interface module 2 further includes a connector installation plate 2-5 used to fix the gas connector, the liquid connector and the brake connector. An outer side of the gas connector, an outer side of the liquid connector and an outer side of the brake connector are provided with a sealing ring, respectively.

As shown in FIG. 5, the connector installation plate 2-5 includes a plurality of installation holes used to fix the gas connector, the liquid connector and the brake connector, and lower portions of the connectors are respectively connected to the gas inlet, the liquid inlet, the liquid outlet and the guide port in the flow channel converging subunit 1-4, and outer sides of the connectors are also provided with sealing rings to further ensure a sealing effect.

On the basis of the above-mentioned embodiment, the interface module 2 and the mask loading module 3 are both arranged below the base plate 3-1 in the lithography apparatus.

During a lithography process, the mask loading module 3 is arranged below the base plate 3-1 in the lithography apparatus. In order to maintain a stability of the immersion field, the interface module 2 is arranged on the base plate 3-1 in the lithography device.

On the basis of the above-mentioned embodiment, a supply and recycling system 4 is further provided, including a gas supply unit, a liquid supply unit and a liquid recycling unit, and the gas supply unit, the liquid supply unit and the liquid recycling unit are connected to the gas connector, the liquid injection connector and the liquid recycling connector, respectively.

As shown in FIG. 1, the supply and recycling system 4 is used to provide or recycle the above-mentioned gas and immersion liquid for the immersion unit 1, so as to ensure the stability of the immersion field.

On the basis of the above-mentioned embodiment, a control system 5 respectively connected to the supply and recycling system 4 and the immersion unit 1 is further provided, and the control system is used to control supply and recycling of the gas, supply and recycling of the liquid and braking of the immersion unit 1.

Figure 6:
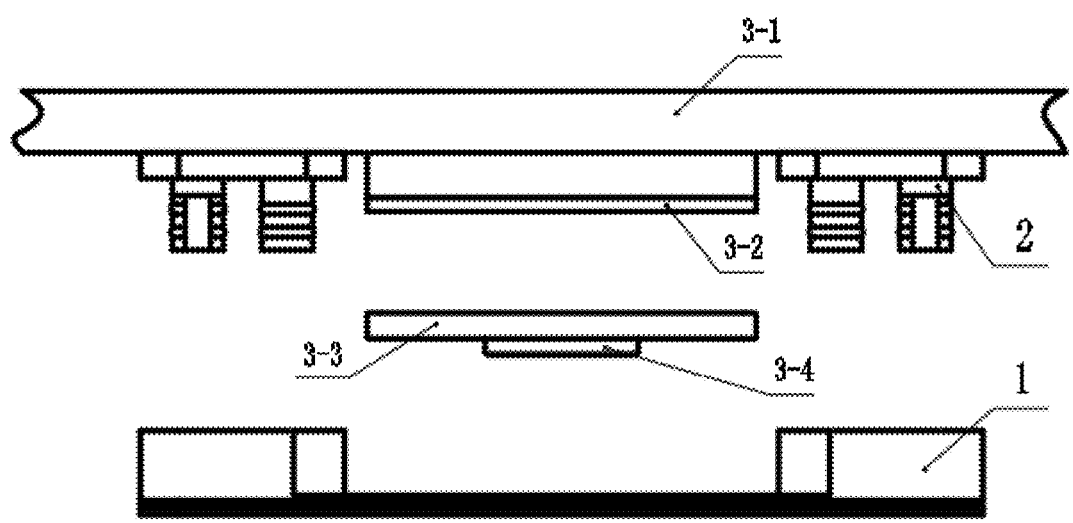
FIG. 6 schematically shows a schematic diagram of a disassembly and an assembly of a mask and an immersion unit of a near-field lithography immersion system according to embodiment of the present disclosure.

As shown in FIG. 1, the control system 5 is used for an automatic operation of the near-field lithography immersion system forming the stable immersion field, and is also used to realize the automatic disassembly and assembly of the immersion unit and the mask. An automatic disassembly and assembly process of the near-field lithography immersion system in the present disclosure is shown in FIG. 6. When replacing the mask (a combination of the mask base plate 3-3 and the mask 3-4) and the immersion unit 1, the control system 5 may automatically control a switch of a valve of each supply and recycling unit in the supply and recycling system 4, a switch of the mask sucker 3-2 and a tightness of the brake connector in the interface module 2. During the disassembly, the immersion unit 1 is first disassembled by a manipulator after the brake connector is released, and the mask 3-4 is disassembled after the switch of the mask sucker 3-2 is turned off. By contrast, during the assembly, the mask is first assembled by the manipulator, and then the immersion unit 1 is assembled.

The present disclosure will be further described by the specific embodiments. The above-mentioned near-field lithography immersion system, the immersion unit of the near-field lithography immersion system and the interface module of the near-field lithography immersion system will be described in detail in the following embodiments. However, the following embodiments are only used to illustrate the present disclosure, and the scope of the present disclosure is not limited thereto.

As shown in FIG. 1, there is provided a near-field lithography immersion system, including: the immersion unit 1 used to integrate gas injection, liquid injection and liquid recycling so as to ensure the sealing and the stability of the immersion field; the interface module 2 used to connect liquid supply, gas supply, recycling and braking; the mask loading module 3 used for the suck and the installation of the lithography mask 3-4; the supply and recycling system 4 used to stably and efficiently supply and recycle a medium; and the control system 5 used to control liquid supply, gas supply, recycling and the braking.

As shown in FIG. 2, the immersion unit 1 of the immersion system includes the air curtain flow channel subunit 1-1, the immersion flow channel subunit 1-2, the immersion flow channel sealing subunit 1-3 and the flow channel converging subunit 1-4. The air curtain flow channel subunit 1-1 includes the above-mentioned gas flow channel, and the immersion flow channel subunit 1-2 includes the above-mentioned liquid flow channel. In the embodiment, four subunits in the immersion unit 1 are four flow channel plates which are stacked and sealed, and the four flow channel plates may be integrally formed by processing or fixed as a whole by a bonding method. A sealing between different flow channels needs to be ensured to avoid gas or liquid mixing. The gas curtain flow channel subunit 1-1 is located on a first layer, and gas is introduced through a flow channel arranged thereon. An annular gas curtain is formed at a periphery of the immersion field through a gas outlet of the gas flow channel, so that the immersion liquid may not flow out. The immersion flow channel subunit 1-2 is located on a second layer, a lower surface of which seals the air curtain flow channel subunit 1-1, and an upper surface of which is designed with the liquid injection flow channel and the liquid recycling flow channel at different positions. The liquid injection flow channel guides the liquid to an edge of the exposure field. According to surface tension characteristics of liquid, the liquid is injected at a certain angle at a liquid outlet of the liquid injection flow channel to form the immersion field between the mask 3-4 and the substrate 3-5. The angle may be selected by those of ordinary skill in the art according to liquid characteristics and requirements of near-field lithography. A liquid recycling port of the liquid recycling flow channel is provided between the gas outlet of the gas flow channel and the liquid outlet of the liquid injection flow channel, and is used to recycle overflowing liquid or all the liquid. The immersion flow channel sealing subunit 1-3 is located on a third layer, and is used to seal the liquid injection flow channel and the liquid recycling flow channel. The immersion flow channel subunit 1-2 and the immersion flow channel sealing subunit 1-3 further include a gas inlet hole through which gas and/or liquid passes, that is, the introduced gas enters the gas flow channel by passing through the gas inlet of the flow channel converging subunit 1-4, a gas inlet hole provided on the immersion flow channel sealing subunit 1-3 and a gas inlet hole provided on the immersion flow channel sealing subunit 1-2. The introduced liquid enters the liquid injection flow channel by passing through the liquid inlet of the flow channel converging subunit 1-4 and a liquid inlet hole provided on the immersion flow channel sealing subunit 1-3. The liquid in the immersion field is recycled by passing through a liquid outlet hole provided on the immersion flow channel sealing subunit 1-3 and the liquid outlet of the flow channel converging subunit 1-4. In the embodiment, the gas inlet hole provided on the immersion flow channel sealing subunit 1-3 and the gas inlet hole provided on the immersion flow channel subunit 1-2 are coaxially arranged. However, the technical solution to be protected in the present disclosure further includes other arrangements of the gas inlet holes, as long as the gas may reach the gas flow channel of the air curtain flow channel subunit 1-1 by passing through the gas inlet hole provided on the immersion flow channel sealing subunit 1-3 and the gas inlet hole provided on the immersion flow channel subunit 1-2. All flow channels on the air curtain flow channel subunit 1-1 and the immersion flow channel subunit 1-2 finally converge to the flow channel converging subunit 1-4 in a fourth layer. In addition, since the larger an area of the near-field lithography mask 3-4 close to the substrate 3-5, the more difficult the liquid is injected, thus a size of the mask 3-4 should be designed to be equivalent to a size of the exposure field. The mask 3-4 may be cut to the size of the exposure field and then bonded to the mask base plate 3-3, or the mask may be customized into a combination of the mask 3-4 and the mask base plate 3-3 integrally formed. Each subunit in the immersion unit 1 may be guided from below the mask base plate 3-3 to the edge of the mask 3-4, that is, the edge of the exposure field.

As shown in FIG. 3, the immersion unit of the immersion system includes four rectangular flow channel converging subunits 1-4, and the four rectangular flow channel converging subunits 1-4 are uniformly arranged around the exposure field.

As shown in FIG. 4, the mask loading module 3 matching the immersion system includes the device base plate 3-1, the mask sucker 3-2, the mask base plate 3-3 and the mask 3-4 from top to bottom. The immersion unit 1 is installed on the device base plate 3-1 through the interface module 2, and the mask loading module 3 is also installed on the device base plate 3-1.

As shown in FIG. 5, the interface module 2 (connection mechanism) of the immersion unit includes the gas connector 2-1, the liquid injection connector 2-2, the liquid recycling connector 2-3, a linear guide connector 2-4, the connector installation plate 2-5, a sealing ring 2-6 and a brake 2-7. The linear guide connector 2-4 is the above-mentioned brake connector, and the brake 2-7 is used to connect the interface module 2 and the flow channel converging plate 1-4. The gas connector 2-1, the liquid injection connector 2-2, the liquid recycling connector 2-3 and the linear guide connector 2-4 are all installed below the connector installation plate 2-5, and are installed in one-to-one correspondence with the gas inlet, the liquid inlet, the liquid outlet and the guide port on the flow channel converging plate 1-4. The sealing ring 2-6 is installed on the gas connector 2-1, the liquid injection connector 2-2 and the liquid recycling connector 2-3, so as to ensure a sealing docking of the immersion unit 1 with the interface module 2. The brake 2-7 is installed in the guide port on the flow channel converging plate 1-4, and when the immersion unit 1 is automatically up and down, the brake 2-7 may automatically loosen and tighten the linear guide connector 2-4. The number of the interface modules 2 is matched with the number of the flow channel converging plates 1-4 of the immersion unit 1, this is to ensure a structural stability and control a gas-liquid direction through different interface modules 2.

The near-field lithography immersion system of the present disclosure may solve the problem that it is difficult to form a stable immersion field in a case of a short working distance by providing the immersion unit. At the same time, the matching arrangement of the immersion unit and the interface module may solve the problem that it is difficult to automatically disassemble and assemble the immersion unit and the mask in a case of realizing the stable immersion field.

The above-mentioned specific embodiments have described in detail the objectives, technical solutions and advantages of the present disclosure. It should be noted that the above are only specific embodiments of the present disclosure and are not intended to limit the present disclosure. Any modifications, equivalent substitutions, improvements, and the like made within the spirit and scope of the present disclosure shall be included in the scope of protection of the present disclosure.

What is claimed is:

1. A near-field lithography immersion unit, an immersion field being formed between a mask and a substrate, wherein the near-field lithography immersion unit comprises an air curtain flow channel subunit, an immersion flow channel subunit, an immersion flow channel sealing subunit and a flow channel converging subunit which are sequentially stacked from bottom to top;
    wherein a gas flow channel is provided in the air curtain flow channel subunit, and gas is introduced through the gas flow channel;
    wherein the immersion flow channel subunit is configured to seal the gas flow channel of the air curtain flow channel subunit and is provided with a liquid injection flow channel and a liquid recycling flow channel, liquid is introduced through the liquid injection flow channel into an exposure field to form an immersion field, and the liquid is recycled through the liquid recycling flow channel, wherein the gas forms an air curtain surrounding the immersion field at a periphery of the immersion field;
    wherein the immersion flow channel sealing subunit is configured to seal the liquid injection flow channel and the liquid recycling flow channel of the immersion flow channel subunit;
    wherein the flow channel converging subunit is provided with a gas inlet, a liquid inlet and a liquid outlet respectively connected to the gas flow channel, the liquid injection flow channel and the liquid recycling flow channel; and
    wherein the flow channel converging subunit is configured to introduce the gas and the liquid into the immersion unit through a connection to an interface module and recycle the liquid from the immersion unit.

2. The near-field lithography immersion unit according to claim 1, wherein the liquid injection flow channel and the liquid recycling flow channel, the introduced gas enters the gas flow channel by sequentially passing through the gas inlet, a gas inlet hole provided on the immersion flow channel sealing subunit and a gas inlet hole provided on the immersion flow channel subunit, the introduced liquid enters the liquid injection flow channel by sequentially passing through the liquid inlet and a liquid inlet hole provided on the immersion flow channel sealing subunit, and led liquid flows out of the liquid recycling flow channel by sequentially passing through a liquid outlet hole provided on the immersion flow channel sealing subunit and the liquid outlet.

3. The near-field lithography immersion unit according to claim 1, wherein a guide port is further provided on the flow channel converging subunit, and a brake is installed in the guide port; and
    wherein a number of the flow channel converging subunits is four, and the flow channel converging subunits are uniformly arranged at four corners of the immersion unit.

4. The near-field lithography immersion unit according to claim 1, wherein the air curtain flow channel subunit, the immersion flow channel subunit, the immersion flow channel sealing subunit and the flow channel converging subunit in the immersion unit are integrally formed or detachably connected to each other.

5. The near-field lithography immersion unit according to claim 1, wherein the liquid injection flow channel is configured to introduce the liquid into the exposure field through a liquid outlet of the liquid injection flow channel at a predetermined angle to form the immersion field, the gas flow channel is configured to introduce gas into the periphery of the immersion field through a gas outlet of the gas flow channel arranged outside the liquid outlet of the liquid injection flow channel to form an annular air curtain, and a liquid recycling port of the liquid recycling flow channel is arranged between the gas and the liquid outlet of the liquid injection flow channel.

6. A near-field lithography interface module used in conjunction with the near-field lithography immersion unit according to claim 1 and installed on the flow channel converging subunit, comprising:
 a gas connector having an end installed in a gas inlet of the flow channel converging subunit to introduce gas;
 a liquid injection connector having an end installed in a liquid inlet of the flow channel converging subunit to introduce liquid;
 a liquid recycling connector having an end installed in a liquid outlet of the flow channel converging subunit to recycle the liquid;
 a linear guide connector having an end installed in a brake in a guide port of the flow channel converging subunit; and
 a connector installation plate configured to fix the other end of the gas connector, the other end of the liquid injection connector, the other end of the liquid recycling connector and the other end of the linear guide connector.

7. The near-field lithography interface module according to claim 6, wherein a number of interface modules is matched with a number of flow channel converging subunits, and an outer side of the gas connector, an outer side of the liquid injection connector and an outer side of the liquid recycling connector are provided with a sealing ring, respectively.

8. A near-field lithography immersion system, comprising:
 an apparatus base plate;
 a mask loading module installed on the apparatus base plate and configured to install a mask;
 the near-field lithography immersion unit according to claim 1 installed on the apparatus base plate through the interface module comprising:
  a gas injection connector having an end installed in a gas inlet of the flow channel converging subunit to introduce gas;
  a liquid injection connector having an end installed in a liquid inlet of the flow channel converging subunit to introduce liquid;
  a liquid recycling connector having an end installed in a liquid outlet of the flow channel converging subunit to recycle the liquid;
  a linear guide connector having an end installed in a brake in a guide port of the flow channel converging subunit; and
  a connector installation plate configured to fix the other end of the gas injection connector, the other end of the liquid injection connector, the other end of the liquid recycling connector and the other end of the linear guide connector;
 a supply and recycling system configured to provide gas and liquid to the near-field lithography immersion unit through the interface module and recycle the liquid; and
 a control system electrically connected to the supply and recycling system and the near-field lithography immersion unit to control liquid supply, gas supply, recycling and braking.

9. The near-field lithography immersion system according to claim 8, wherein the mask loading module comprises a mask sucker, a mask base plate and a mask which are sequentially arranged from top to bottom, the mask and the mask base plate are integrally formed or detachably connected to each other, and a size of the mask is the same as a size of an exposure field.

10. The near-field lithography immersion system according to claim 9, wherein the air curtain flow channel subunit of the immersion unit and the immersion flow channel subunit of the immersion unit are at least guided from below a mask base plate to an edge of the mask.

* * * * *